(12) United States Patent
Wu et al.

(10) Patent No.: US 11,832,496 B1
(45) Date of Patent: Nov. 28, 2023

(54) COLOR DISPLAY WITH COLOR FILTER LAYER COMPRISING TWO-DIMENSIONAL PHOTONIC CRYSTALS FORMED IN A DIELECTRIC LAYER

(71) Applicant: Taiwan Semiconductor Manufacturing Company, Hsinchu (TW)

(72) Inventors: Hong-Shyang Wu, Taipei (TW); Kuo-Ming Wu, Hsinchu (TW)

(73) Assignee: Taiwan Semiconductor Manufacturing Company LTD, Hsinchu (TW)

( * ) Notice: Subject to any disclaimer, the term of this patent is extended or adjusted under 35 U.S.C. 154(b) by 0 days.

(21) Appl. No.: 17/749,295

(22) Filed: May 20, 2022

(51) Int. Cl.
| | |
|---|---|
| *H10K 59/38* | (2023.01) |
| *G02F 1/1335* | (2006.01) |
| *H10K 59/50* | (2023.01) |
| *B82Y 20/00* | (2011.01) |
| *H10K 59/12* | (2023.01) |

(52) U.S. Cl.
CPC ....... *H10K 59/38* (2023.02); *G02F 1/133514* (2013.01); *H10K 59/50* (2023.02); *B82Y 20/00* (2013.01); *G02F 2202/32* (2013.01); *H10K 59/1201* (2023.02)

(58) Field of Classification Search
CPC ..... G02B 1/005; B82Y 20/00; G02F 2202/32; G02F 1/133514; H10K 59/1201; H10K 59/50; H10K 59/38
See application file for complete search history.

(56) References Cited

U.S. PATENT DOCUMENTS

| | | | |
|---|---|---|---|
| 10,529,290 B1* | 1/2020 | Parsons | G02F 1/133514 |
| 2005/0062903 A1 | 3/2005 | Cok et al. | |
| 2005/0140286 A1* | 6/2005 | Ito | H10K 85/6574 |
| | | | 313/506 |
| 2018/0190929 A1* | 7/2018 | Koch | H10K 50/171 |
| 2020/0033671 A1* | 1/2020 | Wang | G02F 1/133617 |

FOREIGN PATENT DOCUMENTS

CN             113383610 A     9/2021

* cited by examiner

*Primary Examiner* — Jonathan Y Jung
(74) *Attorney, Agent, or Firm* — Lippes Mathias LLP

(57) ABSTRACT

In a color display, a color filter layer includes a dielectric layer with an array of photonic crystals, an electroluminescent material disposed on the color filter layer, and electrodes arranged to electrically energize the electroluminescent material to output white light. Each photonic crystal includes a two-dimensional (2D) array of features. The 2D array of features includes a central cavity within which the features of the 2D array of features are omitted. Each photonic crystal is tuned to a resonant wavelength by a periodicity of the two-dimensional array of features. The array of photonic crystals may include, for example, red, green, and blue photonic crystals arranged to form an array of pixels spanning a display area of the color display, in which each pixel includes at least one red photonic crystal, at least one green photonic crystal, and at least one blue photonic crystal.

20 Claims, 8 Drawing Sheets

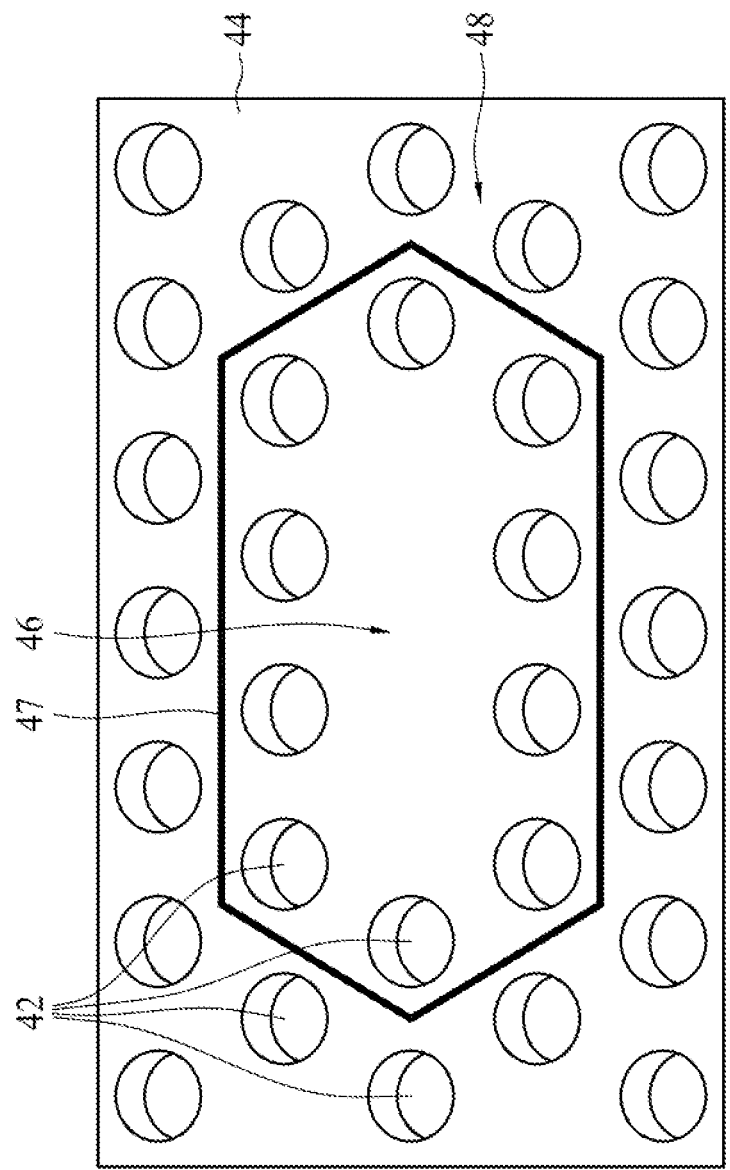

COLOR DISPLAY WITH COLOR FILTER LAYER COMPRISING TWO-DIMENSIONAL PHOTONIC CRYSTALS FORMED IN A DIELECTRIC LAYER

BACKGROUND

The following relates to the color display arts, organic light emitting diode (OLED) display arts, quantum dot (QD) display device arts, active matrix OLED (AMOLED) display arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 diagrammatically illustrates the same enlarged perspective view of the central portion of the photonic crystal of FIG. 3 as is shown in FIG. 4, but with an inner cavity and outer zone delineated.

DETAILED DESCRIPTION

Figure 1:
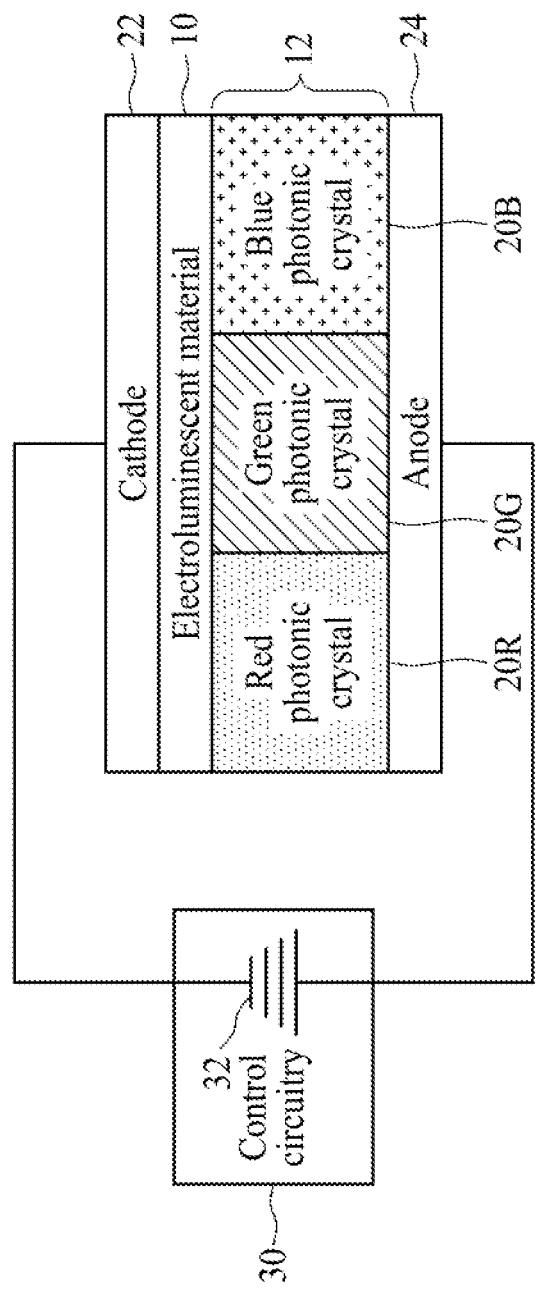
FIG. 1 diagrammatically illustrates a high level side-sectional view of a color display employing an electroluminescent material emitting white light and a color filter layer made up of photonic crystals comprising two-dimensional (2D) arrays of features formed in a dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following relates to color displays of types employing an electroluminescent material optically coupled with an array of color filters of at least three different colors. For a full-color display, the three different filter colors are suitably primary colors, typically red, green, and blue for a light-emissive color display. Embodiments disclosed herein employ a color filter layer made up of photonic crystals comprising two-dimensional (2D) arrays of features formed in a dielectric layer. The disclosed color displays employing color filters in accordance with this approach provide numerous advantages such as low cost manufacturing with a small number of workflow steps or operations, improved planarity of the multicolor light emission structure of a color display, facility for high precision and run-to-run reproducibility in defining the emission wavelengths, and facilitation of scalability to smaller pixel size (and hence higher resolution display), in some embodiments entailing only employing a different photomask to achieve a multicolor light emission structure with a different (e.g. higher) pixel resolution.

With reference to FIG. 1, a high level side-sectional view is diagrammatically illustrated of a color display employing a multicolor emission structure that includes an electroluminescent material 10 designed to emit white light, and a color filter layer 12 made up of photonic crystals 20R, 20G, 20B comprising 2D arrays of features formed in a dielectric layer. The photonic crystals are tuned to red, green, and blue primary colors, i.e. the photonic crystals 20R are tuned to red, the photonic crystals 20G are tuned to green, and the photonic crystals 20B are tuned to blue. Furthermore, electrodes 22, 24 are arranged to electrically energize the electroluminescent material 10 to output light. In the example of FIG. 1, the electroluminescent material 10 outputs white light including at least all three primary (e.g. red, green, and blue) color components. (More typically, the output white light has a spectrum extending over most or all of the visible range, i.e. 400-700 nm wavelength).

In some embodiments, the electroluminescent material is an organic electroluminescent diode (OLED) material. In some embodiments, the electroluminescent material is a colloidal quantum dot (QD) electroluminescent material. Other types of electroluminescent materials are also contemplated as the electroluminescent material 10. In the illustrative examples, the electroluminescent material 10 is an OLED material, and the electrodes 22, 24 include a cathode 22 and an anode 24. It is to be understood that FIG. 1 is a high-level diagrammatic representation, and the multicolor emission structure 10, 12 and associated electrodes 22, 24 may include numerous additional layers or components not shown. For example, in the case of an OLED color display in which the electroluminescent material 10 is an OLED material, such additional layers or components may for example include an electron injection or transport layer (EIL or ETL) disposed between the cathode 22 and the emission structure 10, 12, and/or a hole transport or injection layer (HTL or HIL) disposed between the anode 24 and the emission structure 10, 12. Moreover, the ordering of the stack of layers shown in FIG. 1 could be varied—for example, it is contemplated for one of the electrodes 22, 24 to be interposed between the electroluminescent material 10 and the color filter layer 12. The overall structure may be disposed on (and optionally formed on) a substrate made of glass, sapphire, or another material, and various additional layers may be provided as interface modification layers or the like.

These additional components may be configured to structure the color display as a bottom-emitting display in which the display is observed from the substrate-side (in which case the light passes through the substrate which should be transparent over the spectrum of interest, e.g. over the visible spectrum), or as a top-emitting display in which the display is observed from the side opposite the substrate. For the OLED display example, the bottom-emitting configuration is sometimes referred to as a bottom-emitting OLED display (BEOLED) and the top-emitting configuration is sometimes referred to as a top-emitting OLED display (TEOLED). In general, the configuration for bottom- or top-emission includes making the electrode on the emission side optically transparent over the visible spectrum (for example, made of indium tin oxide, i.e. ITO or a sufficiently thin metal to be light-transmissive) and making the electrode on the side opposite the emission side optically reflective over the visible spectrum (for example, made of gold or another metal of sufficient thickness to be optically opaque).

Furthermore, the color display typically includes control circuitry 30 configured to selectively apply an electrical bias 32 (e.g., voltage or current) to selected pixels of the display, or to sub-pixels of particular color(s) of the selected pixels, to form a desired color image. The control circuitry 30 is diagrammatically shown in FIG. 1 separately from the optical stack, but in some implementations is constructed as an electronics layer incorporated into the optical stack (i.e., the stack including the electroluminescent material 10 and the color filter layer 12, along with the electrodes 22, 24). By way of some nonlimiting illustrative examples, the control circuitry 30 may implement an active matrix addressing scheme. For example, such active matrix control circuitry may comprise a thin-film transistor (TFT) array in which the TFTs are, for example, polycrystalline silicon (poly-Si) or amorphous silicon (a-Si) TFTs, together with at least one of the electrodes 22, 24 being segmented to form addressable pixels each of which is independently electrically biased (or not biased, depending on the content being displayed) by a corresponding TFT of the array of TFTs. In the case of such active matrix addressing and using an OLED material as the electroluminescent material 10, the color display may be referred to as an active-matrix OLED display (AMOLED display). In other embodiments, the control circuitry 30 may implement a passive matrix addressing scheme. The control circuitry 30 typically forms a backplane (e.g., a TFT backplane) that is disposed on the side of the light emission structure (e.g. comprising the electroluminescent material 10 and layer of photonic crystals 20R, 20G, 20B) opposite from the light-emission side. In some embodiments, the TFT backplane is fabricated on a glass, sapphire or other substrate, and the optical stack 10, 12 and electrodes 22, 24 are then fabricated on the TFT backplane, although other fabrication sequences are contemplated such as separately fabricating the TFT backplane and the optical stack and subsequently bonding the two stacks together.

Figure 2:
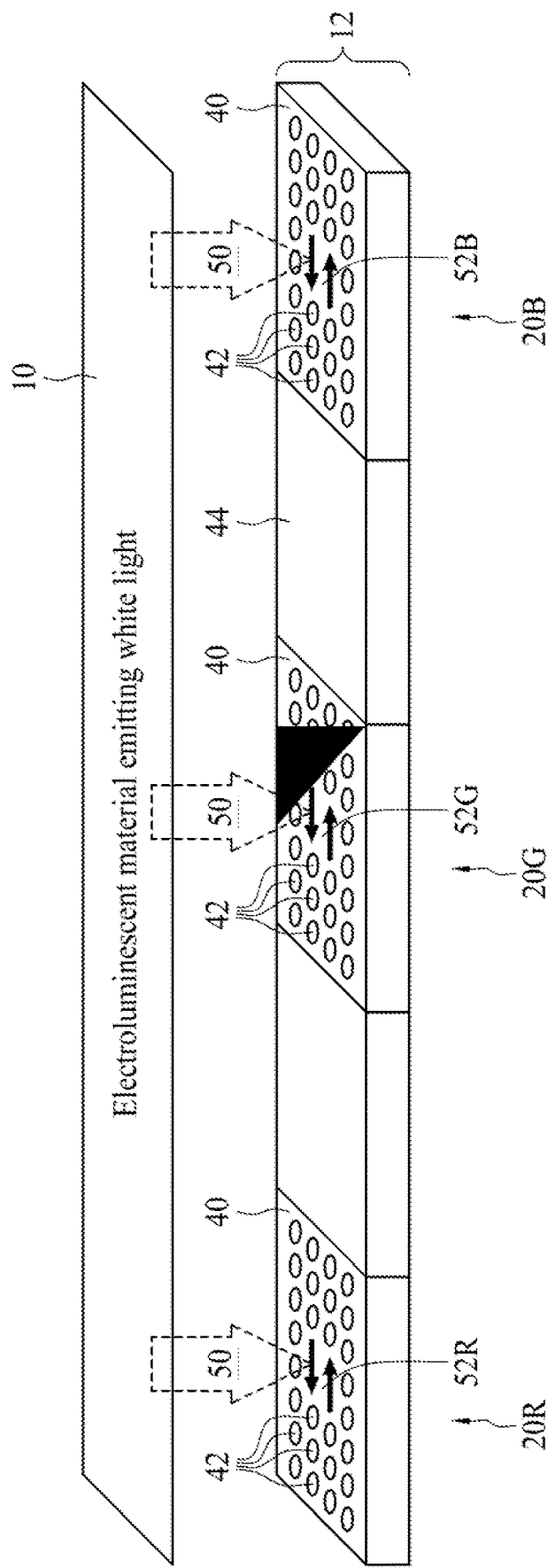
FIG. 2 diagrammatically illustrates operation of a color filter layer made up of photonic crystals comprising 2D arrays of features formed in a dielectric layer.

With continuing reference to FIG. 1 and with further reference to FIG. 2, in some illustrative embodiments the color filter layer 12 is made up of photonic crystals 20R, 20G, 20B where each photonic crystal comprises a two-dimensional (2D) array 40 of features 42 formed in a dielectric layer 44, as diagrammatically shown in FIG. 2. The dielectric layer 44 has a first refractive index, denoted herein as $n_1$, which may vary as a function of wavelength due to dispersion but is usually relatively constant over the visible spectrum of about 400-700 nm. For example, the refractive index of $SiO_2$ varies from about 1.47 at 400 nm to about 1.45 at 700 nm. The dielectric layer is typically an oxide layer such as a silicon oxide layer, for example stoichiometric $SiO_2$ or a silicon oxide of another stoichiometry. More generally, the dielectric layer 44 can be any dielectric material which is suitably translucent or transparent over the visible spectrum, such as silicon nitride (e.g. stoichiometric $Si_3N_4$), hafnium oxide (e.g. stoichiometric $HfO_2$), or so forth. The features 42 of each 2D array 40 of features 42 may, for example, comprise air or a filler dielectric material (that is different from the dielectric material of the dielectric layer 44). In another embodiments, the features 42 may comprise the electroluminescent material 10, which can be convenient from a manufacturing standpoint as the features comprising electroluminescent material 10 can be formed by filling openings etched into the dielectric layer 44 with the electroluminescent material 10 in a single spin coating or other deposition step that also deposits the electroluminescent material 10 as a layer on the color filter layer 12 as shown in FIG. 1. The features 42 of each 2D array 40 have a second refractive index, denoted herein as $n_2$, which is different from the first refractive index $n_1$ of the dielectric layer 44. Put another way, $n_1 \neq n_2$. Again, the second refractive index may vary as a function of wavelength due to dispersion but is usually relatively constant over the visible spectrum of about 400-700 nm. For example, the refractive index of air is about 1.00 over the visible spectrum.

Figure 3:
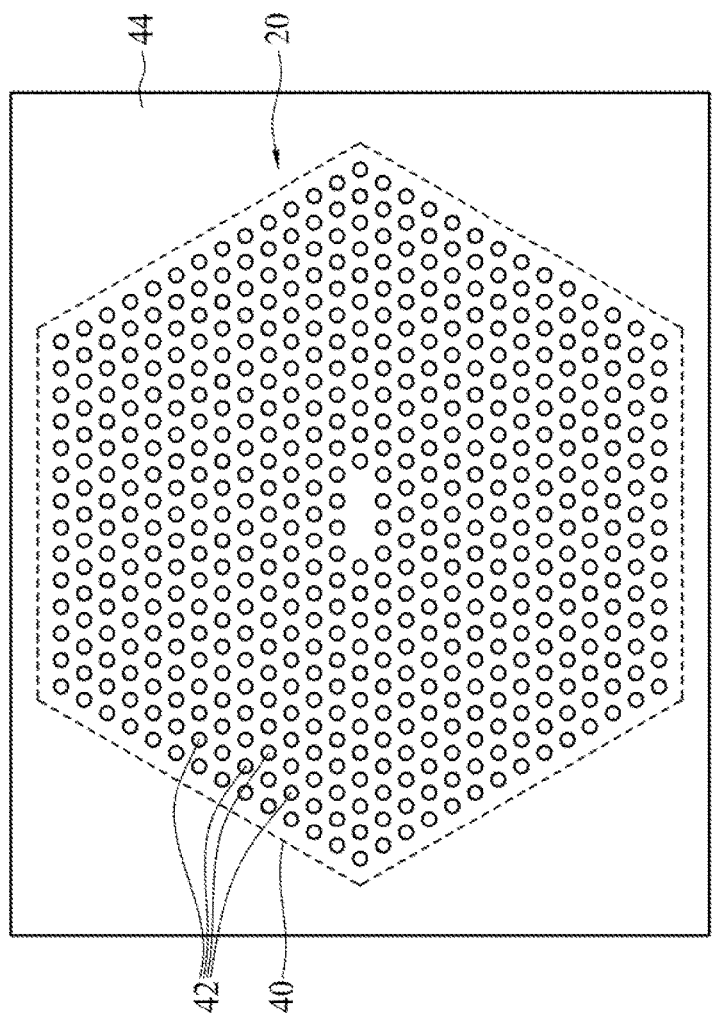
FIG. 3 diagrammatically illustrates a top view of a photonic crystal comprising a 2D array of features formed in a dielectric layer.
Figure 4:
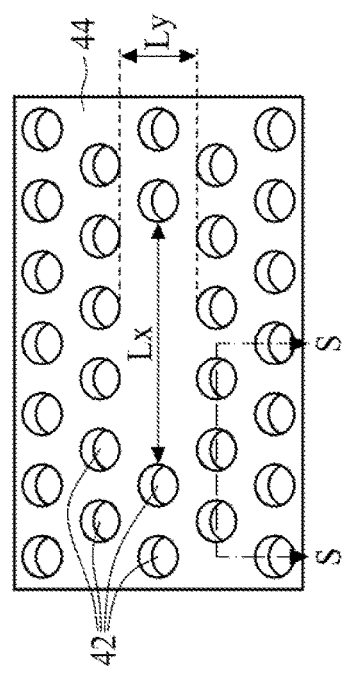
FIG. 4 diagrammatically illustrates an enlarged perspective view of a central portion of the photonic crystal of FIG. 3.

With reference to FIGS. 3, 4, and 5, an illustrative example of a generic photonic crystal 20 comprising a 2D array 40 of features 42 formed in a dielectric layer 44 is shown. The illustrative 2D array 40 of FIG. 3 is a hexagonal array 40 of features 42; however, the array could have other geometries (for example, rectangular arrays as shown for the photonic crystals 20R, 20G, and 20B of FIG. 2). The features 42 of each 2D array 40 of features 42 forming a photonic crystal are periodically spaced, so that the photonic crystal is tuned to a resonant wavelength by a periodicity of the 2D array 40 of features 42. The 2D periodicity of the array 40 of features 42 is two-dimensional in that the features 42 have inter-feature spacing that is periodic in two non-parallel in-plane directions, such as in x- and y-directions. This is shown in the enlarged view of FIG. 4, as a spacing $L_x$ along an x-direction and a spacing $L_y$ along a y-direction that is orthogonal to the x-direction in the plane of the dielectric layer 44. In some embodiments, the periodicities may be written as:

$$L_x = \frac{m_x}{2} \frac{\lambda_{res}}{n_{pc}} \text{ where } m_x = 1, 3, 5, \ldots \quad (1)$$

and $$L_y = \frac{m_y}{2} \frac{\lambda_{res}}{n_{pc}} \text{ where } m_y = 1, 3, 5, \ldots \quad (2)$$

where $\lambda_{res}$ is the resonant wavelength in a vacuum (which is equivalent to the resonant wavelength in air since the refractive index $n_{air}$ of air is suitably close to the ideal refractive index n=1 for a vacuum), $n_{pc}$ is the refractive index of the photonic crystal (which is typically about equal to the first refractive index $n_1$ of the dielectric material, neglecting the effect of the second refractive index $n_2$ of the features of the array of features on the photonic crystal medium), and $m_x$ and $m_y$ are odd positive integers. If the dispersion of $n_{pc}$ (that is, its value as a function of wavelength) cannot be neglected, then in designing a photonic crystal for each of the red, green, and blue (or each of other primary colors) the value of $n_{pc}$ for that wavelength is suitably used. In other words, the value $n_{pc}(\lambda_{res,R})$ is suitably used when selecting the periodicities $L_x$ and $L_y$ for the red photonic crystal 20R (where $\lambda_{res,R}$ is the resonant wavelength of red light), and analogously for the green and blue photonic crystals 20G and 20B. In some embodiments, $m_x=m_y$, however this may not be the case in some other embodiments.

As previously discussed with reference to Equations (1) and (2), the periodicity of the 2D array 40 of features 42 beneficially provides for the photonic crystal (for example, generic photonic crystal 20 of FIG. 3) to be tuned to the target resonant wavelength $\lambda_{res}$ by the periodicity of the 2D array 40 of features 42. However, in the illustrative embodiments, this periodicity is removed in a central region of the 2D array 40 of features 42, thus forming a cavity within which the light (e.g. light 52R, 52G, or 52B of FIG. 2) is strongly confined.

With reference to FIG. 5, this is illustrated for the hexagonal photonic crystal 20 of FIG. 3. FIG. 5 illustrates the same enlarged perspective view of the central portion of the photonic crystal of FIG. 3 that is shown in FIG. 4, but with labeling of the dielectric layer 44 and the features 42. As labeled in FIG. 5, a central cavity 46 is delineated by a boundary 47, and a peripheral zone or region 48 is delineated as the portion of the photonic crystal 20 lying outside of the boundary 47. In the core of the central cavity 46, the features 42 are omitted, thus forming a cavity of the photonic crystal 20 within which the light (e.g. light 52R, 52G, or 52B of FIG. 2) is strongly confined by the features 42. The light output by the electroluminescent material 10 is enhanced significantly by resonant coupling within the central cavity 46, thus substantially increasing the intensity of the light at the resonant wavelength $\lambda_{res}$ of the photonic crystal 20 and providing the desired spectral filtering to $\lambda_{res}$.

In the illustrative embodiment, the boundary 47 is hexagonal, however depending on the photonic crystal design this boundary could have a circular, square, or other geometry. The central cavity 46 may in some embodiments includes relatively few of the features 42, optionally with a central-most portion containing none of the features as shown, and the features 42 that are in the central cavity 46 may be staggered as shown. The outer zone or region 48 contains the features 42 with the specified periodicity, e.g. as designed using Equations (1) and (2). It is to be appreciated that this is merely an illustrative example.

With returning reference to FIGS. 1 and 2, each photonic crystal 20R, 20G, and 20B (or, more generically, for the photonic crystal 20 of FIGS. 3-5) comprises a corresponding 2D array 40 of features 42 formed in the dielectric layer 44, which is tuned to the target resonant wavelength $\lambda_{res}$ (e.g., $\lambda_{res}$ is a red wavelength for a red photonic crystal 20R, $\lambda_{res}$ is a green wavelength for a green photonic crystal 20G, and $\lambda_{res}$ is a blue wavelength for a blue photonic crystal 20B) by the periodicity $L_x$ and $L_y$ of the two-dimensional array 40 of features 42 making up that photonic crystal. Equations (1) and (2) can be used to design the periodicity for a given resonant wavelength $\lambda_{res}$ and the refractive index $n_p$, of the photonic crystal (and more particularly $n_{pc}$ at the specific target $\lambda_{res}$ if the refractive index dispersion is sufficient to call for using a wavelength-specific refractive index). When the electrodes 22, 24 electrically energize the electroluminescent material 10 to emit white light 50 (see FIG. 2) that is optically coupled with a photonic crystal, the white light 50 is laterally confined in the plane of the dielectric layer 44 by the 2D array 40 of features 42—that is, the 2D array 40 of features 42 forms a photonic crystal. There is no analogous confinement in the direction transverse to the plane of the dielectric layer 44 since there is no periodicity in that direction. (Some limited optical confinement could be present due to any abrupt refractive index step at the surfaces of the dielectric layer 44; however, if this is a problem then anti-reflection coatings could be added to these surfaces to further reduce or eliminate optical confinement transverse to the plane of the dielectric layer 44).

With continuing reference to FIG. 2, confined resonant light in the plane of the dielectric layer 44 within the photonic crystals is diagrammatically depicted by arrows. Particularly, the red photonic crystal 20R is resonant for red light 52R. The green photonic crystal 20G is resonant for green light 52G. The blue photonic crystal 20B is resonant for blue light 52B. As already described with reference to Equations (1) and (2), the wavelength $\lambda_{res}$ of the light which is resonant for each photonic crystal depends on the periodicity of the features 42 of the array 40 of features 42 making up that photonic crystal. The strength of the optical resonance provided by the photonic crystal depends in part on the difference between the first refractive index $n_1$ of the host dielectric layer 44 and the second refractive index $n_2$ of the features 42. This difference can be quantified, for example, using the refractive index contrast $\Delta$ given by:

$$\Delta = \frac{(n_1^2 - n_2^2)}{2n_1^2} \quad (3)$$

A larger value for the refractive index contrast $\Delta$ generally leads to stronger resonance and improved color selection by the photonic crystal. The photonic crystal can suitably operate with either $n_1 > n_2$ or with $n_1 < n_2$.

Figure 7:
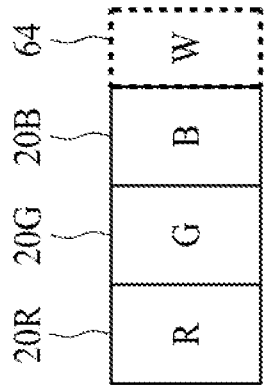
FIGS. 6 and 7 diagrammatically illustrate two layout embodiments for red, green, and blue photonic crystals forming a pixel of a color display.
Figure 6:
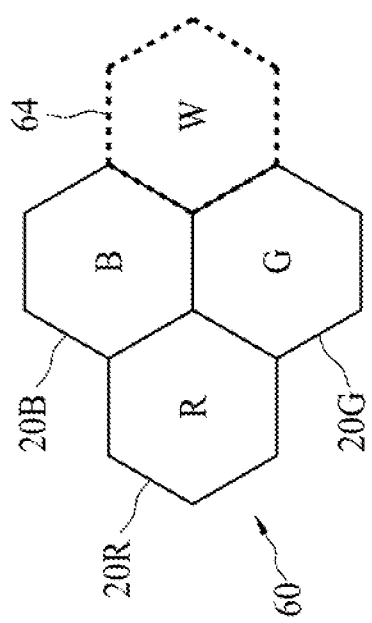

With reference to FIGS. 6 and 7, moreover, the first-color photonic crystals (e.g. red photonic crystals 20R), the second-color photonic crystals (e.g. green photonic crystals 20G), and the third-color photonic crystals (e.g. blue photonic crystals 20B) are suitably arranged to form a pixel 60 (FIG. 6) or pixel 62 (FIG. 7) that includes at least one first-color photonic crystal 20R, at least one second-color photonic crystal 20G, and at least one third-color photonic crystal 20B. The pixel 60 of FIG. 6 has photonic crystals formed by hexagonal arrays 40 of features 42 (such as that shown in FIG. 3), while the pixel 62 of FIG. 7 has photonic crystals formed by rectangular arrays 40 of features 42 (such as that shown in FIG. 2). These are merely illustrative examples. Moreover, while the illustrative pixels 60 and 62 have one red photonic crystal 20R, one green photonic crystal 20G, and one blue photonic crystal 20B, it is contemplated to include more than one of selected crystals—for example, some display designs may have each pixel include two green photonic crystals 20G to improve the perceived color balance.

Furthermore, as indicated by dashed lines in FIGS. 6 and 7, it is contemplated to have each pixel 60 or 62 further include a white element 64 to provide a higher quality of white light than might be achieved by operating the red, green, and blue "sub-pixels" together. The white element 64, if included, can be readily implemented by not including any array of features in the area of the dielectric layer 44 corresponding to the white element 64. In this way, the white light 50 is not modified by any photonic crystal in that area and hence is output as high quality white light. (In such a design, the TFT array backplane 30 in an active matrix design suitably include an additional TFT for controlling emission of the white light 50 at the location of the white element 64). As another contemplated variant, instead of adding the white element 64 the pixel could incorporate an additional color element, i.e. a fourth-color photonic crystal tuned to a fourth resonant wavelength different from the first, second, and third resonant wavelengths, or even a fifth-color photonic crystal or more.

Figure 8:
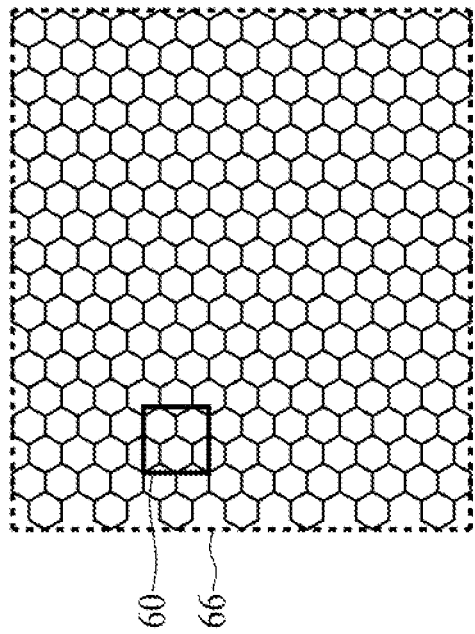
FIG. 8 diagrammatically illustrates an array of pixels as shown in FIG. 6 spanning a display area of a color display.

With reference to FIG. 8, it will be further understood that to implement the color display the first-color photonic crystals 20R, the second-color photonic crystals 20G, and the third-color photonic crystals 20B are arranged to form an array of pixels 60 or 62 spanning a display area 66 of the color display. Illustrative example of FIG. 8 shows by way of nonlimiting illustrative example pixels 60 of FIG. 6 (without the optional white element 64) spanning the display area 66; however, the pixels could be otherwise designed, such as the rectangular pixels 62 of FIG. 7, and/or the pixels can include the white element 64. FIG. 8 is diagrammatic, and it will be appreciated that in typical color displays for televisions, color computer displays, or the like the number of pixels 60 is much larger than shown, e.g. a typical computer display may have a 1920×1080 array of pixels 60, as one specific non-limiting illustrative example.

Figure 11:
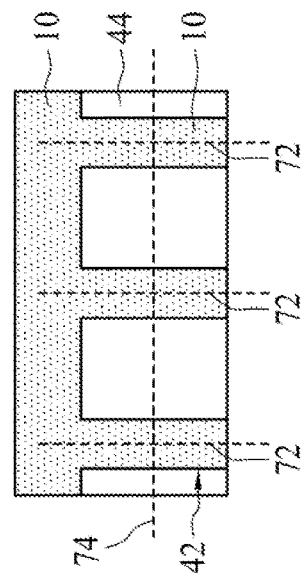
FIGS. 9, 10, and 11 diagrammatically illustrate Section S-S indicated in FIG. 4, according to three respective embodiments.
Figure 10:
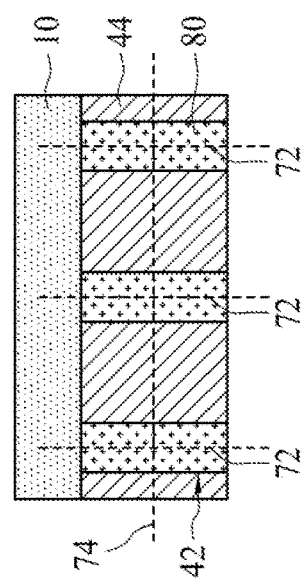
Figure 9:
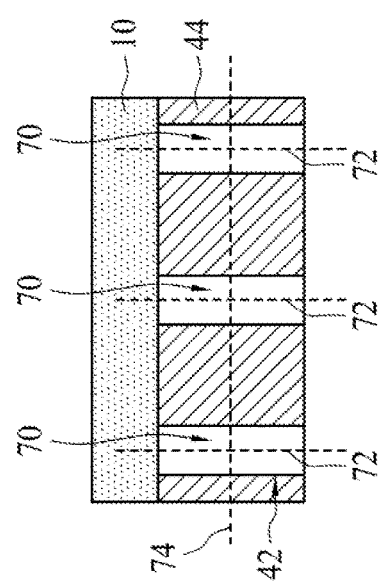

With reference back to FIGS. 3-5 and with further reference to FIGS. 9, 10, and 11, some suitable approaches for fabricating the color filter layer 12 including the features 42 are described. FIGS. 9-11 depict Section S-S indicated in FIG. 4 and corresponding to a plane oriented perpendicular to the plane of the dielectric layer 44 (and hence also perpendicular to the plane of the color filter layer 12) and that passes through three features 42, according to three different embodiments.

With particular reference to FIG. 9, in this embodiment the features 42 are cylindrical features 42 comprising cylindrical openings 70 passing through the dielectric layer 44, with a central axis 72 of each opening oriented perpendicular to the plane 74 of the dielectric layer 44. The cylindrical openings 70 can have any cross-sectional shape, e.g. circular, oval, square, rectangular, hexagonal, or so forth. The cylindrical openings 70 can, for example, be formed by photolithographically controlled etching of the dielectric layer 44. Also shown in FIG. 9 is the electroluminescent material 10 disposed as a coating on the color filter layer 12. In the embodiment of FIG. 9, the features 42 comprise the cylindrical openings 70 filled with air. This can be achieved if, for example, the electroluminescent material 10 is sufficiently viscous and the cross-sectional diameter of the cylindrical openings 70 is small enough so that the electroluminescent material 10 does not flow into the openings 70. In another approach, the air-filled openings 70 can be formed after deposition of the electroluminescent material 10. Because the openings 70 are filled with air, in this embodiment the second refractive index for the features 42 is the refractive index of air, that is, $n_2=1.00$.

With particular reference to FIG. 10, in this embodiment the features 42 comprise filler dielectric material 80 forming cylindrical features 42 passing through the dielectric layer 44. The cylindrical filler dielectric material features 42 of this embodiment have cylinder axes 72 again oriented perpendicular to the plane 74 of the dielectric layer. These cylindrical filler dielectric material features 42 may be formed by photolithographically controlled etching of the dielectric layer 44 to form cylindrical openings analogous to the cylindrical openings 70 of the embodiment of FIG. 9, followed by a deposition process in which the openings are filled with the filler dielectric material 80. In one suitable approach, this entails a spin coating, sputtering, or other suitable deposition of the filler dielectric material 80 followed by chemical-mechanical polishing (CMP) to remove any filler dielectric material coating the surface of the dielectric layer 44. An advantage of this embodiment is that the second refractive index $n_2$ is the refractive index of the filler dielectric material 80, and hence the second refractive index $n_2$ is amenable to design by choice of the filler dielectric material 80. For example, if the dielectric layer 44 is a low-k dielectric material such as silicon dioxide ($SiO_2$, for which $n_1=1.47$ at 400 nm to about $n_1=1.45$ at 700 nm) then the filler dielectric material 80 could be a high-k dielectric material such as silicon nitride ($Si_3N_4$, yielding $n_2 \cong 2.0$-$2.1$ depending on wavelength).

With particular reference to FIG. 11, in this embodiment the features 42 comprise portions of the electroluminescent material 10 filling openings that pass through the dielectric layer 44 (analogous to the openings 70 of the embodiment of FIG. 9). The features 42 comprising cylindrical portions of the translucent material 10 of this embodiment have cylinder axes 72 yet again oriented perpendicular to the plane 74 of the dielectric layer. These cylindrical portions of the translucent material forming the features 42 may be formed by photolithographically controlled etching of the dielectric layer 44 to form cylindrical openings analogous to the cylindrical openings 70 of the embodiment of FIG. 9, followed by deposition of the electroluminescent material 10 over the surface of the dielectric layer 44 such a way that the deposited electroluminescent material 10 also flows into and fills those cylindrical openings. To achieve such filling, the electroluminescent material 10 is sufficiently fluid and the cross-sectional diameter of the cylindrical openings is large enough so that the electroluminescent material 10 flows into the openings. In this embodiment, the second refractive index $n_2$ is the refractive index of the electroluminescent material 10. An advantage of this embodiment is that no additional step is performed to fill the openings (versus the embodiment of FIG. 10 which entails the additional deposition/CMP to deposit the filler dielectric material 80 in the openings). Another advantage of this embodiment is that the portions of the electroluminescent material 10 disposed in the openings passing through the dielectric layer 44 can be energized by the electrodes 22, 24 (see FIG. 1) so as to increase to total volume of the electroluminescent material 10 providing the light 50 (see FIG. 2).

Figure 12:
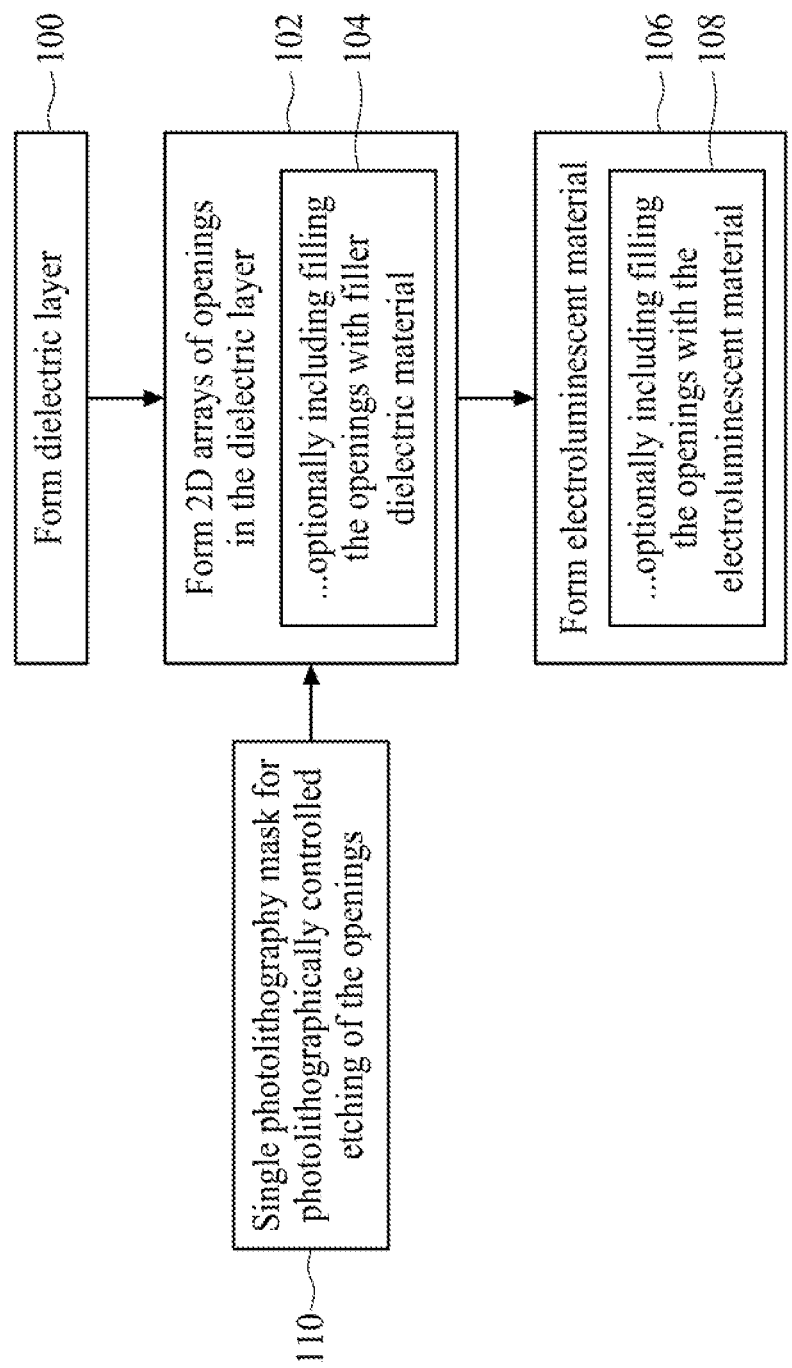
FIG. 12 shows a flow chart of a suitable manufacturing method for forming a multicolor light emission structure of a color display employing an electroluminescent material emitting white light and including a color filter layer made up of photonic crystals comprising 2D arrays of features formed in a dielectric layer.

With reference to FIG. 12, a flow chart is shown of a manufacturing method for forming a multicolor light emission structure of a color display employing an electroluminescent material emitting white light and including a color filter layer made up of photonic crystals comprising 2D arrays of features formed in a dielectric layer. For example the manufacturing method of FIG. 12 could be used to manufacture the light emission structure of FIG. 1 including the electroluminescent layer 10 and the color filter layer 12 as previously described. The method starts with forming a dielectric layer (for example, the dielectric layer 44). This may be done, for example, by depositing silicon dioxide ($SiO_2$) or another chosen dielectric material on a suitable substrate such as a glass or sapphire substrate or the like. In some embodiments the substrate may have a previously formed TFT backplate or other electronics layer constituting the control circuitry 30 diagrammatically shown in FIG. 1.

In some embodiments, the operation 100 deposits the dielectric layer 44 with uniform thickness. As a consequence, the resulting color filter layer 12 will also be of uniform thickness. This provides a planar surface on which subsequent layers of the color display are deposited, which can simplify manufacturing and improve reliability and/or performance of the manufactured color display.

In an operation 102, a two-dimensional array of openings is formed in the dielectric layer. These openings may constitute the features 42 of the 2D array 40 of features 42 as in the embodiment of FIG. 9. Alternatively, in an optional operation 104, after forming the openings they may be filled with filler dielectric material, e.g. with filler dielectric material 80 forming cylindrical features 42 passing through the dielectric layer 44 as in the embodiment of FIG. 10.

In an operation 106, electroluminescent material is formed on the dielectric layer. For example, the electroluminescent material formed in the operation 106 may be the electroluminescent material 10 as previously described. The operation 106 may deposit the electroluminescent material 10 on the dielectric layer using spin coating or another suitable approach. In a nonlimiting illustrative embodiment, the material deposited by spin coating or the like to form the electroluminescent material 10 as an OLED material comprises a liquid polymer containing fluorescent or phosphorescent dye, polymer, or other suitable molecule. In another nonlimiting illustrative embodiment, the material deposited by spin coating or the like to form the electroluminescent material 10 comprises a liquid polymer containing colloidal quantum dots (QDs) so as to form the electroluminescent material as a colloidal QD electroluminescent material. Optionally, the operation 106 may form the electroluminescent material as a multilayer stack, for example including electron and/or hole injection or transport layer(s). For embodiments in accordance with FIG. 11, the operation 106 also results in the electroluminescent material filling the openings made in operation 102, as indicated by block 108 of FIG. 12, so as to form the features 42 of the 2D array 40 of features 42 as cylindrical columns of the electroluminescent material 10 passing through the dielectric layer.

With continuing reference to FIG. 12, an advantage of the above-described manufacturing process is that it can be performed in some embodiments using only a single photolithography mask 110 for the operation 102 to form all of the 2D arrays 40 of features 42 of all photonic crystals of the color filter layer 12. By contrast, if the color filter layer is constructed using, for example, dielectric layers of different thicknesses for the different resonant wavelengths (e.g. red, green, and blue), then multiple photomasks will typically be used to form the regions with these different thicknesses. Moreover, the approach of FIG. 12 is readily scalable to form multicolor light emission structures for color displays of different display resolutions, by employing an embodiment of the photomask 110 for the desired display resolution. Still further, as the wavelength selection provided by the photonic crystals is determined by the periodicity of the 2D arrays of features which is in turn determined by the photomask 110, this results in the manufacturing process of FIG. 12 providing precise run-to-run reproducibility in defining the emission wavelengths.

With returning reference to FIG. 1, the embodiments described thus far employ the white electroluminescent material 10 which outputs white light when energized by the electrodes 22, 24. In these designs, the red, green, and blue (or other primary colors) of the color display are achieved by wavelength selection provided by the photonic crystals 20R, 20G, and 20B.

Figure 13:
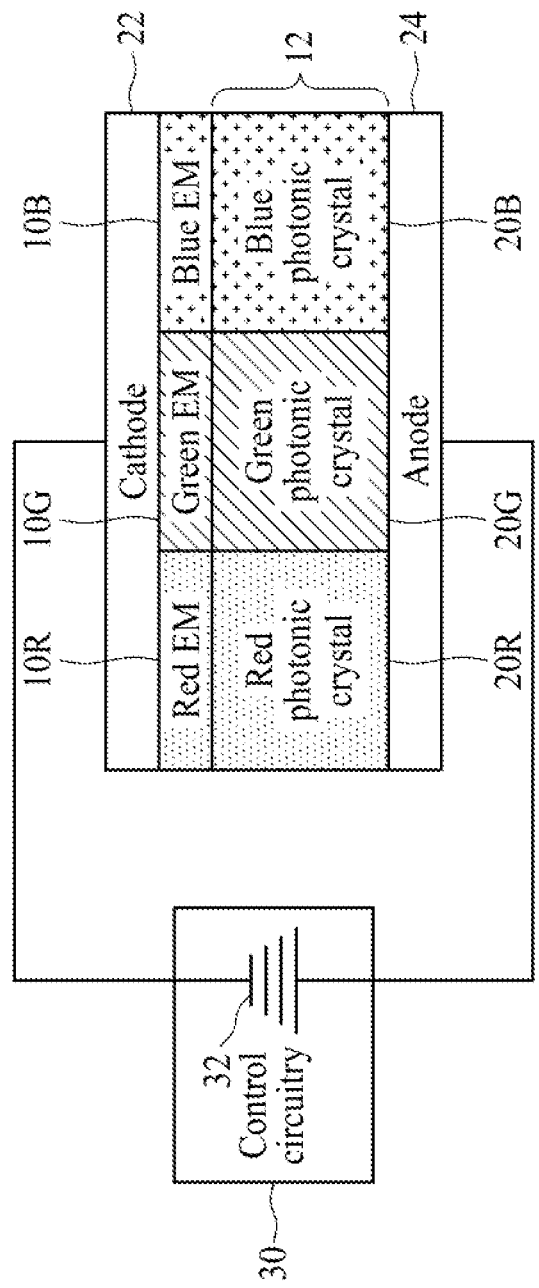
FIG. 13 diagrammatically illustrates a high level side-sectional view of a color display employing red-emitting, green-emitting, and blue-emitting electroluminescent materials and a color filter layer made up of photonic crystals comprising 2D arrays of features formed in a dielectric layer.

With reference to FIG. 13, another color display embodiment is similar to that of FIG. 1, except that in the embodiment of FIG. 13 the white electroluminescent material 10 is replaced by regions of red electroluminescent material 10R, regions of green electroluminescent material 10G, and regions of blue electroluminescent material 10B (or, more generally, by regions of first-color electroluminescent material 10R, regions of second-color electroluminescent material 10G, and regions of third-color electroluminescent material 10B). As shown in FIG. 13, the regions of red electroluminescent material 10R are aligned with corresponding red photonic crystals 20R, the regions of green electroluminescent material JOG are aligned with corresponding green photonic crystals 20G, and the regions of blue electroluminescent material JOB are aligned with corresponding blue photonic crystals 208. Operation of this embodiment is analogous to that of FIG. 1, except that in this case the photonic crystals serve to improve the color purity of the red, green, and blue light output by the respective red, green, and blue electroluminescent material 10R, 10G, and 10B.

In the following, some further embodiments are described.

In a nonlimiting illustrative embodiment, a color display comprises: a color filter layer comprising an array of photonic crystals formed in a dielectric layer having a first refractive index; an electroluminescent material optically coupled with the color filter layer; and electrodes arranged to electrically energize the electroluminescent material to output light. Each photonic crystal includes a 2D array of features. The features have a second refractive index different from the first refractive index. The photonic crystal is tuned to a resonant wavelength by a periodicity of the 2D array of features. The array of photonic crystals includes first-color photonic crystals tuned to a first resonant wavelength, second-color photonic crystals tuned to a second resonant wavelength that is different from the first resonant wavelength, and third-color photonic crystals tuned to a third resonant wavelength that is different from the first resonant wavelength and that is different from the second resonant wavelength. The first-color photonic crystals, the second-color photonic crystals, and the third-color photonic crystals are arranged to form an array of pixels spanning a display area of the color display, in which each pixel includes at least one first-color photonic crystal, at least one second-color photonic crystal, and at least one third-color photonic crystal.

In a nonlimiting illustrative embodiment, a method of fabricating a color display comprises forming a dielectric layer over a display area of the color display wherein the dielectric layer has a first refractive index, forming 2D arrays of features in the dielectric layer, and coating the dielectric layer with an electroluminescent material. The 2D arrays of features formed in the dielectric layer include: first 2D arrays of features having a first periodicity and forming first-color photonic crystals tuned to a first resonant wavelength; second 2D arrays of openings having a second periodicity that is different from the first periodicity and forming second-color photonic crystals tuned to a second resonant wavelength different from the first resonant wavelength; and third 2D arrays of openings having a third periodicity that is different from the first periodicity and that is different from the second periodicity and forming third-color photonic crystals tuned to a third resonant wavelength different from the first resonant wavelength and different from the second resonant wavelength.

In a nonlimiting illustrative embodiment, a color display comprises a color filter layer including a dielectric layer with a first refractive index and with an array of photonic crystals formed therein, an electroluminescent material disposed on the color filter layer, and electrodes arranged to electrically energize the electroluminescent material to cause the electroluminescent material to output white light. Each photonic crystal includes a 2D array of features. The features have a second refractive index different from the first refractive index. The 2D array of features includes a central cavity within which the features of the 2D array of features are omitted. Each photonic crystal is tuned to a resonant wavelength by a periodicity of the two-dimensional array of features. The array of photonic crystals include red photonic crystals tuned to a red resonant wavelength, green photonic crystals tuned to a green resonant wavelength, and blue photonic crystals tuned to a blue resonant wavelength. The red photonic crystals, the green photonic crystals, and the blue photonic crystals are arranged to form an array of pixels spanning a display area of the color display, in which each pixel includes at least one red photonic crystal, at least one green photonic crystal, and at least one blue photonic crystal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A color display comprising:
    a color filter layer comprising an array of photonic crystals formed in a dielectric layer having a first refractive index;
    an electroluminescent material optically coupled with the color filter layer; and
    electrodes arranged to electrically energize the electroluminescent material to output light;
    wherein each photonic crystal includes a two-dimensional array of features, the features having a second refractive index different from the first refractive index, the photonic crystal being tuned to a resonant wavelength by a periodicity of the two-dimensional array of features;
    wherein the array of photonic crystals includes first-color photonic crystals tuned to a first resonant wavelength, second-color photonic crystals tuned to a second resonant wavelength that is different from the first resonant wavelength, and third-color photonic crystals tuned to a third resonant wavelength that is different from the first resonant wavelength and that is different from the second resonant wavelength; and
    wherein the first-color photonic crystals, the second-color photonic crystals, and the third-color photonic crystals are arranged to form an array of pixels spanning a display area of the color display, in which each pixel includes at least one first-color photonic crystal, at least one second-color photonic crystal, and at least one third-color photonic crystal.

2. The color display of claim 1 wherein the dielectric layer has a uniform thickness across the display area of the color display.

3. The color display of claim 1 wherein the electroluminescent material comprises a coating disposed on the dielectric layer.

4. The color display of claim 3 wherein:
    the electroluminescent material also fills openings in the dielectric layer of the color filter layer,
    the features of the two-dimensional array of features comprise the openings in the dielectric layer filled with the electroluminescent material, and
    the electroluminescent material has the second refractive index.

5. The color display of claim 1 wherein the features of the two-dimensional array of features comprise openings in the dielectric layer filled with air or filler dielectric material, and wherein the second refractive index is the refractive index of the air or filler dielectric material.

6. The color display of claim 1 wherein the features of the two-dimensional array of features comprise cylindrical features that pass through the dielectric layer and have cylinder axes oriented perpendicular to a plane of the dielectric layer.

7. The color display of claim 1 wherein the periodicity of the two-dimensional array of features includes a first periodicity with a period L along a first direction x in a plane of the dielectric layer and a second periodicity with a period $L_y$ along a second direction y in the plane of the dielectric layer.

8. The color display of claim 1 wherein each photonic crystal further includes a central cavity within which the features of the two-dimensional array of features are omitted.

9. The color display of claim 1, wherein the electroluminescent material comprises an organic electroluminescent diode (OLED) material or a colloidal quantum dot (QD) electroluminescent material.

10. The color display of claim 1 wherein the electroluminescent material emits white light when electrically energized by the electrodes.

11. The color display of claim 1 wherein the electroluminescent material includes:
    first-color electroluminescent material emitting light of a first color that includes the first resonant wavelength, the first-color electroluminescent material being optically coupled with the first-color photonic crystals tuned to the first resonant wavelength;
    second-color electroluminescent material emitting light of a second color that includes the second resonant wavelength, the second-color electroluminescent material being optically coupled with the second-color photonic crystals tuned to the second resonant wavelength; and third-color electroluminescent material emitting light of a third color that includes the third resonant wavelength, the third-color electroluminescent material being optically coupled with the third-color photonic crystals tuned to the third resonant wavelength.

12. The color display of claim 1 wherein the first resonant wavelength is a red wavelength, the second resonant wavelength is a green wavelength, and the third resonant wavelength is a blue wavelength.

13. A method of fabricating a color display, the method comprising:
   forming a dielectric layer over a display area of the color display wherein the dielectric layer has a first refractive index;
   forming two-dimensional arrays of features in the dielectric layer; and
   coating the dielectric layer with an electroluminescent material;
   wherein the two-dimensional arrays of features formed in the dielectric layer include:
      first two-dimensional arrays of features having a first periodicity and forming first-color photonic crystals tuned to a first resonant wavelength,
      second two-dimensional arrays of openings having a second periodicity that is different from the first periodicity and forming second-color photonic crystals tuned to a second resonant wavelength different from the first resonant wavelength, and
      third two-dimensional arrays of openings having a third periodicity that is different from the first periodicity and that is different from the second periodicity and forming third-color photonic crystals tuned to a third resonant wavelength different from the first resonant wavelength and different from the second resonant wavelength.

14. The method of claim 13 wherein the forming of the dielectric layer comprises forming the dielectric layer with a uniform thickness over the display area.

15. The method of claim 13 wherein the electroluminescent material has a second refractive index which is different from the first refractive index, and the forming of the two-dimensional arrays of features in the dielectric layer includes:
   before the coating of the dielectric layer with the electroluminescent material, forming two-dimensional arrays of openings in the dielectric layer;
   wherein the coating of the dielectric layer with the electroluminescent material further fills the openings of the two-dimensional arrays of openings with the electroluminescent material, the features of the two-dimensional arrays of features being the openings in the dielectric layer filled with the electroluminescent material.

16. The method of claim 13 wherein the forming of the two-dimensional arrays of features in the dielectric layer includes:
   forming two-dimensional arrays of openings in the dielectric layer; and
   filling the openings in the dielectric layer with a filler dielectric material having a second refractive index that is different from the first refractive index.

17. The method of claim 13 wherein the forming of the two-dimensional arrays of features in the dielectric layer includes:
   forming two-dimensional arrays of openings in the dielectric layer by photolithographically controlled etching using a single photolithography mask, the features of the two-dimensional arrays of features being the openings or the openings filled by a filler material or the openings filled by the electroluminescent material.

18. The method of claim 13 wherein the electroluminescent material comprises an organic electroluminescent diode (OLED) material or a colloidal quantum dot (QD) electroluminescent material.

19. A color display comprising:
   a color filter layer comprising a dielectric layer with a first refractive index and with an array of photonic crystals formed therein;
   an electroluminescent material disposed on the color filter layer; and
   electrodes arranged to electrically energize the electroluminescent material to cause the electroluminescent material to output white light;
   wherein each photonic crystal includes a two-dimensional array of features, the features having a second refractive index different from the first refractive index, the two-dimensional array of features including a central cavity within which the features of the two-dimensional array of features are omitted, the photonic crystal being tuned to a resonant wavelength by a periodicity of the two-dimensional array of features; and
   wherein the array of photonic crystals include red photonic crystals tuned to a red resonant wavelength, green photonic crystals tuned to a green resonant wavelength, and blue photonic crystals tuned to a blue resonant wavelength; and
   wherein the red photonic crystals, the green photonic crystals, and the blue photonic crystals are arranged to form an array of pixels spanning a display area of the color display, in which each pixel includes at least one red photonic crystal, at least one green photonic crystal, and at least one blue photonic crystal.

20. The color display of claim 19 wherein the features comprise cylindrical columns of the electroluminescent material passing through the dielectric layer, wherein the electroluminescent material has the second refractive index.

* * * * *